(12) United States Patent
Bauer et al.

(10) Patent No.: US 7,656,335 B2
(45) Date of Patent: Feb. 2, 2010

(54) DEVICE FOR DETERMINING A MEASURE FOR A SIGNAL CHANGE AND A METHOD OF PHASE CONTROL

(75) Inventors: Achim Bauer, Villach (AT); Ulrich Gaier, Villach (AT); Frank Lehmacher, Villach (AT); Markus Waldner, Klagenfurt (AT)

(73) Assignee: Micronas GmbH, Freiburg (DE)

( * ) Notice: Subject to any disclaimer, the term of this patent is extended or adjusted under 35 U.S.C. 154(b) by 149 days.

(21) Appl. No.: 11/444,975

(22) Filed: Jun. 1, 2006

(65) Prior Publication Data
US 2006/0273945 A1    Dec. 7, 2006

(30) Foreign Application Priority Data
Jun. 2, 2005    (DE) .................. 10 2005 025 453

(51) Int. Cl.
H03M 1/12    (2006.01)
(52) U.S. Cl. ........................... 341/155; 341/122
(58) Field of Classification Search .............. 341/155, 341/163, 122, 123, 118; 348/572, 573, 625, 348/607
See application file for complete search history.

(56) References Cited

U.S. PATENT DOCUMENTS

| | | | |
|---|---|---|---|
| 4,647,856 A * | 3/1987 | Melgui et al. ............. 324/239 |
| 5,235,422 A * | 8/1993 | Ido et al. .................. 348/537 |
| 5,266,850 A | 11/1993 | Au et al. | |
| 5,475,718 A | 12/1995 | Rosenkranz | |
| 5,576,904 A | 11/1996 | Behrens | |
| 5,936,678 A | 8/1999 | Hirashima | |
| 6,229,862 B1 | 5/2001 | Webb | |
| 6,473,131 B1 | 10/2002 | Neugebauer et al. | |
| 6,587,529 B1 * | 7/2003 | Staszewski et al. ......... 375/371 |
| 7,021,405 B2 * | 4/2006 | Proett et al. ................ 175/65 |
| 7,030,601 B2 * | 4/2006 | Buchhold ............... 324/117 R |
| 2001/0055355 A1 | 12/2001 | Okamoto | |
| 2002/0017934 A1 | 2/2002 | Shoji et al. | |
| 2006/0023120 A1 | 2/2006 | Waldner .................. 348/537 |

OTHER PUBLICATIONS

Abo et al. "A I .5V, 14MS/s CMOS Pipeline Analog-to-Digital Converter," Department of Electrical Engineering and Computer Sciences, University of California, Berkeley, Berkeley, CA, USA, 1998.
Kaplan et al. "A 2-GS/s 3 bit $\Delta\Sigma$-Modulated DAC with Tunable Bandpass Mismatch Shaping," IEEE Journal of Solid-State Circuits, vol. 40, No. 3, pp. 603-610, Mar. 2005.

* cited by examiner

*Primary Examiner*—Brian Young
(74) *Attorney, Agent, or Firm*—O'Shea Getz P.C.

(57) ABSTRACT

A device that determines gradients of a signal compares the change in a signal level between two instants with reference values, and determines a measure for the signal gradient as a function of the comparison. The device functions to effect signal reconstruction, where, for example, the phase of the signal processing clock relative to the gradient measurement clock can be adjusted, or a measure for the signal values between multiple sampling points can be determined. A method for controlling signal curves based on gradient values determines a measure for the gradient curve or the curvature of the signal from the immediate time sequence of multiple gradients. Based on a sequential evaluation of these measures, it is possible to determine the direction of the phase drift of the signal and, for example, to utilize this for synchronization or phase control.

16 Claims, 10 Drawing Sheets

DEVICE FOR DETERMINING A MEASURE FOR A SIGNAL CHANGE AND A METHOD OF PHASE CONTROL

PRIORITY INFORMATION

This patent application claims priority from German patent application 10 2005 025 453.5 filed Jun. 2, 2005, which is hereby incorporated by reference.

BACKGROUND INFORMATION

The invention relates to the field of digital signal processing and in particular to determining a measure for a signal change and a corresponding method of phase control.

Gradient detection for phase control is implemented using a continuous measuring circuit, for example, an operational amplifier wired as a differentiator. A gain adjustment may be implemented following the differentiator, followed by an analog-to-digital converter (ADC) that digitizes the gradient information at a given point in time.

The signal path is, however, continuously under load by a frequency-dependent current flow. In addition, an integrated circuit to implement this operation becomes expensive due to an increased surface-area and power requirement. The phase response of a corresponding sensor circuit must be known and must accordingly be taken into account during the phase control.

Phase control may be performed several different ways. In a first approach, a multiple sampling per pixel period is implemented. The disadvantage here is that, particularly in the case of fast sampling in the signal path, an additional increase in the sampling rate can result in a significant reduction in the resolution of the analog-to-digital converters, and can excessively increase the power drain of these converters.

In a second approach, a transmission is effected with an additional reference signal with a known curve or a known pixel frequency. However, an additional reference signal with a known curve or a known pixel frequency is not available for all applications and may entail a significant additional technical cost.

In a third approach, phase control is effected using statistical techniques, for example, by maximizing the average difference between two successive sampling values. It is possible for large latency times to occur which are critical specifically in regard to moving images. In addition, it may not be possible to correct a phase drift quickly enough.

In a fourth approach according to published German Patent Application DE 10 2004 027 093, a method is described in which digitized gradient values and sampling values are utilized to estimate the phase position of a steady-state signal segment. In this approach, the quality of the control algorithm is a function of the signal curve. If this signal curve deviates from a sinusoidal shape, the control algorithm may no longer operate efficiently.

What is needed is an improved device to determine a measure for a signal change and an improved method to effect phase control.

SUMMARY OF THE INVENTION

A method for determining gradients determines a change in the signal level of an input signal between two instants and compares the change with reference values. A measure of the gradient of the input signal is determined as a function of the comparison.

In particular, the method sets a phase of the clock for processing a signal relative to a measurement clock. Starting with a sequence of multiple gradients, a measure is determined for the gradient curve and/or a curvature of the input signal. In the method, starting with a sequential evaluation of the values of the curvature, a direction of the phase drift of the input signal is determined and is used to control a phase of a clock for a signal processing operation. The method is advantageous if an exact number of signal periods between synchronization signals is not known and/or a transfer rate fluctuates over time. In the method, signal curves are controlled based on values for the determined gradients of the input signal.

A device for determining gradients compares a change in a signal level of an input signal between two instants with reference values, and determines a measure for the signal gradients as a function of the comparison.

A device of this type includes a sample & track stage and a comparison circuit following this stage to compare the change in the signal level with the reference values. A device with a sample & hold stage includes a comparison circuit following this stage to compare the change in the signal level with the reference values. Also advantageous is a device with a stage to effect differential and/or single-ended gradient measurement. This type of device is preferably designed accordingly to implement a method of this type.

According to an aspect of the invention, in many technical applications signal sequences having a time-discrete and value-discrete curve must be processed in a receiver circuit. In this regard, the following problems can result which can be avoided using a gradient detection during a phase control in a time-discrete manner.

If a sufficiently precise clock reconstruction relating to the received signal sequence is effected, for example, by synchronization signals during the signal processing (for an analog-to-digital conversion, for example) it should be ensured that this does not occur during the transition phase between two value-discrete signal states. This is evident in the time-discrete and value-discrete pixel sequence with phase drift relative to the sampling clock illustrated in FIG. 1. Signal contrasts can be significantly reduced as a result. The preferred circuits compare the particularly amplified change in the signal level between two instants with reference values, then determine therefrom an approximate measure for the given signal gradient to be able to adjust the phase of the clock for the signal processing relative to the measurement clock.

Figure 1:
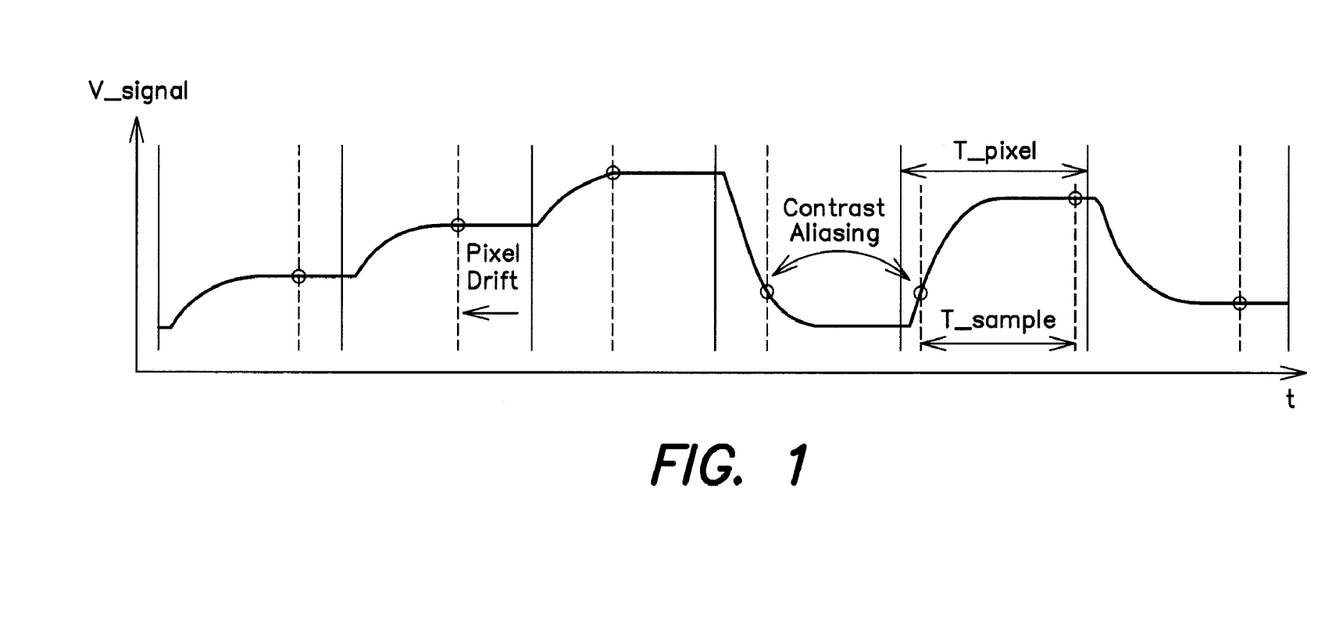
FIG. 1 is a graph illustrating a time-discrete and value-discrete pixel sequence with phase drift relative to the sampling clock.

In this regard, FIG. 1 illustrates the amplitude of a signal voltage, V_signal, over time, t. In regard to the time duration or period, the sampling instants, T_pixel, for the pixels are different from the actual sampling instants, T_sample, which results in contrast aliasing.

If clock reconstruction is no longer possible with the required precision because the number of signal periods between two synchronization signals is unknown, or because the transfer rate fluctuates over time, it is possible preferably to determine an approximate measure for the curvature of the signal from the immediate time sequence of multiple gradients. Based on the sequential evaluation of the curvature values, it is possible to determine the direction of the phase drift of the signal and to utilize this to effect control, as illustrated in FIG. 7.

The goal is to reconstruct the signal curve. In other words, a measure for the signal values between sampling points is determined from the sampled signal values and gradient values, to which end, in particular, an interpolation is implemented.

The above-described disadvantages can be avoided by the circuit and method of the present invention.

Preferred circuits for gradient detection impose only a moderate capacitive load, typically less than 100 F, on the signal path. To minimize the surface area requirement, the resolution of the gradient is limited to a few bits in the implementations according to the invention, for example one bit, as illustrated in FIG. 4. In many applications, however, this abstraction of the gradient does not represent a fundamental limitation for the functioning of the control algorithm. The comparison with the reference voltages can also be implemented in a space-saving manner by an inverter structure, as illustrated in FIG. 5a. As a result, the circuits indicated are quite compact.

If the signal in the application is measured, for example, directly on the input side of an ADC, then the phase relationship between the detected gradient and the sampled signal value is provided in good approximation by the phase difference between the respective digital control signals, where the phase shift along the measurement path can typically be ignored.

The method according to an aspect of the invention has the following advantages in regard to phase control. First, an increase in the sampling rate in the signal path is no longer required. Based on the position of the maximum gradients or the change in the gradient curve, the optimum sampling instant can be set precisely.

Second, no additional reference signal is required. All that is required are the normal synchronization pulses and indication of the frequency of the transmitted signal pixels at a sufficient level of precision. The greatest tolerable frequency deviation depends on the precision of the phasing, or possibly the ratio of the phase-locked loop (PLL) frequency to the pixel frequency, as well as on the critical frequency of the signal path and contrasts in the signal.

Third, large latency times can be avoided. Only a single sensor value need be utilized for the phase correction. As a result, phase control "in real time" or nearly in real time is made possible.

Fourth, the control quality is largely independent of the signal shape. If, on the one hand, the signal curve has a certain minimum value for the gradients in the transition phase, and if on the other hand there are steady-state signal segments in which the gradient lies below this minimum value, then an optimum phase control is possible.

These and other objects, features and advantages of the present invention will become more apparent in light of the following detailed description of preferred embodiments thereof, as illustrated in the accompanying drawings.

BRIEF DESCRIPTION OF THE DRAWINGS

FIG. 2, including

FIG. 3, including

FIG. 4, including

FIG. 5, including

FIG. 7, including

DETAILED DESCRIPTION OF THE INVENTION

The following discussion presents two sensor circuits which differ fundamentally in regard to the type of measured value acquisition.

Figure 2A:
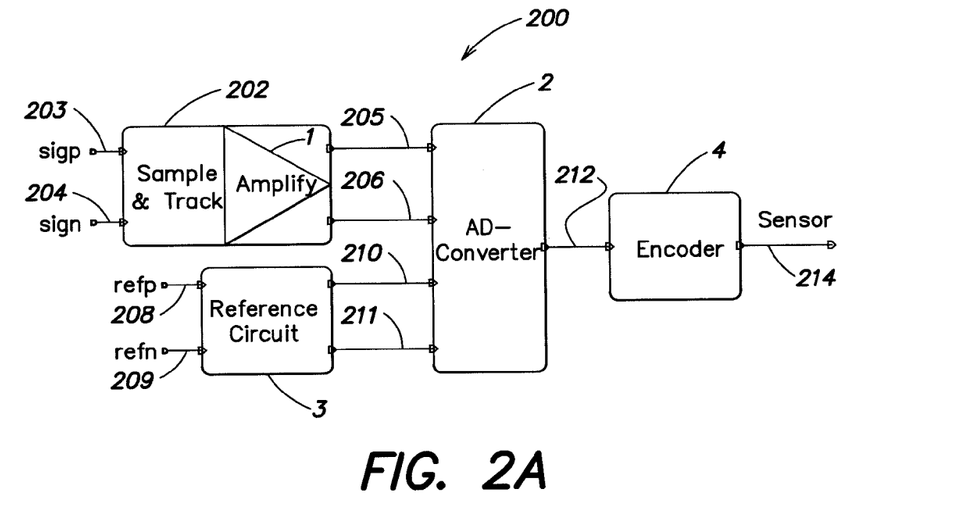
FIGS. 2a and 2b, are block diagram illustrations of gradient measurement with sampling and tracking (sample & track) (FIG. 2a) and sampling and holding (sample & hold) (FIG. 2b)

One such sensor circuit 200 illustrated in FIG. 2a includes an amplifier 1 as an input stage to acquire the gradient, the amplifier operating by the sample & track method. A sample & track stage 202 may be connected on the input side of the amplifier 1 or integrated into the input section of the amplifier. The track stage 202 receives two input signals, sigp, sign, on lines 203, 204, respectively. The signals are amplified and associated amplified signals are output on lines 205, 206, to an ADC 2. A reference circuit 3 receives two reference signals, refp, refn, on lines 208, 209, respectively, where two outputs of the reference circuit 3 on lines 210, 211 are also applied to the ADC 2. The ADC provides a digitized output signal on line 212 to an encoder 4 that provides an output signal on line 214.

Figure 2B:
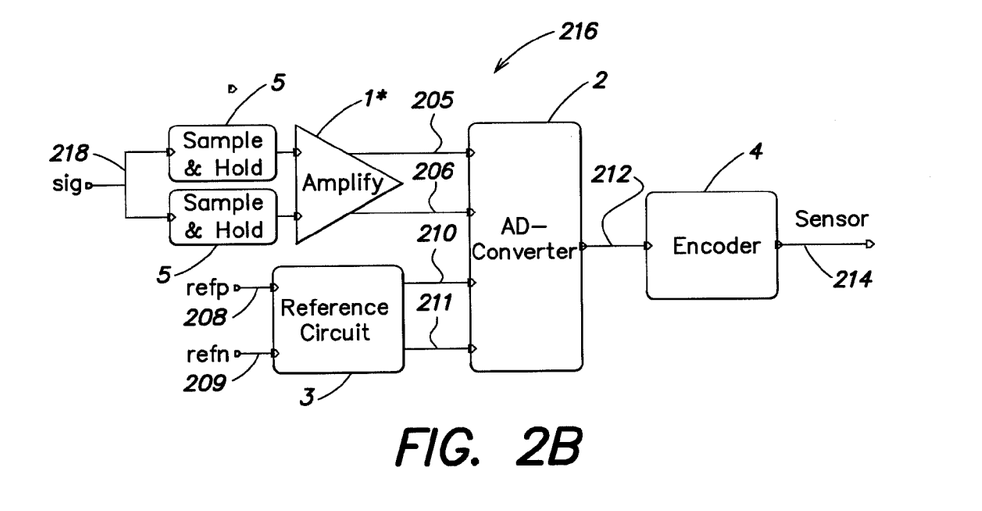

The sensor circuit 216 illustrated in FIG. 2b, on the other hand, detects the gradient in a single-ended manner through two sample & hold stages 5 which are driven in a time-shifted manner. The sampled and amplified gradient is essentially analog-to-digital converted in both cases in the ADC 2. The converter result can then also be appropriately encoded in the encoder 4. The circuit 216 of FIG. 2b thus differs from the circuit 200 of FIG. 2a in that in FIG. 2b the sample & hold stages 5 are connected on the input side of an amplifier 1* at its inputs, while a common input signal, sig, on line 218 is applied to both sample & hold stages 5.

Figure 3A:
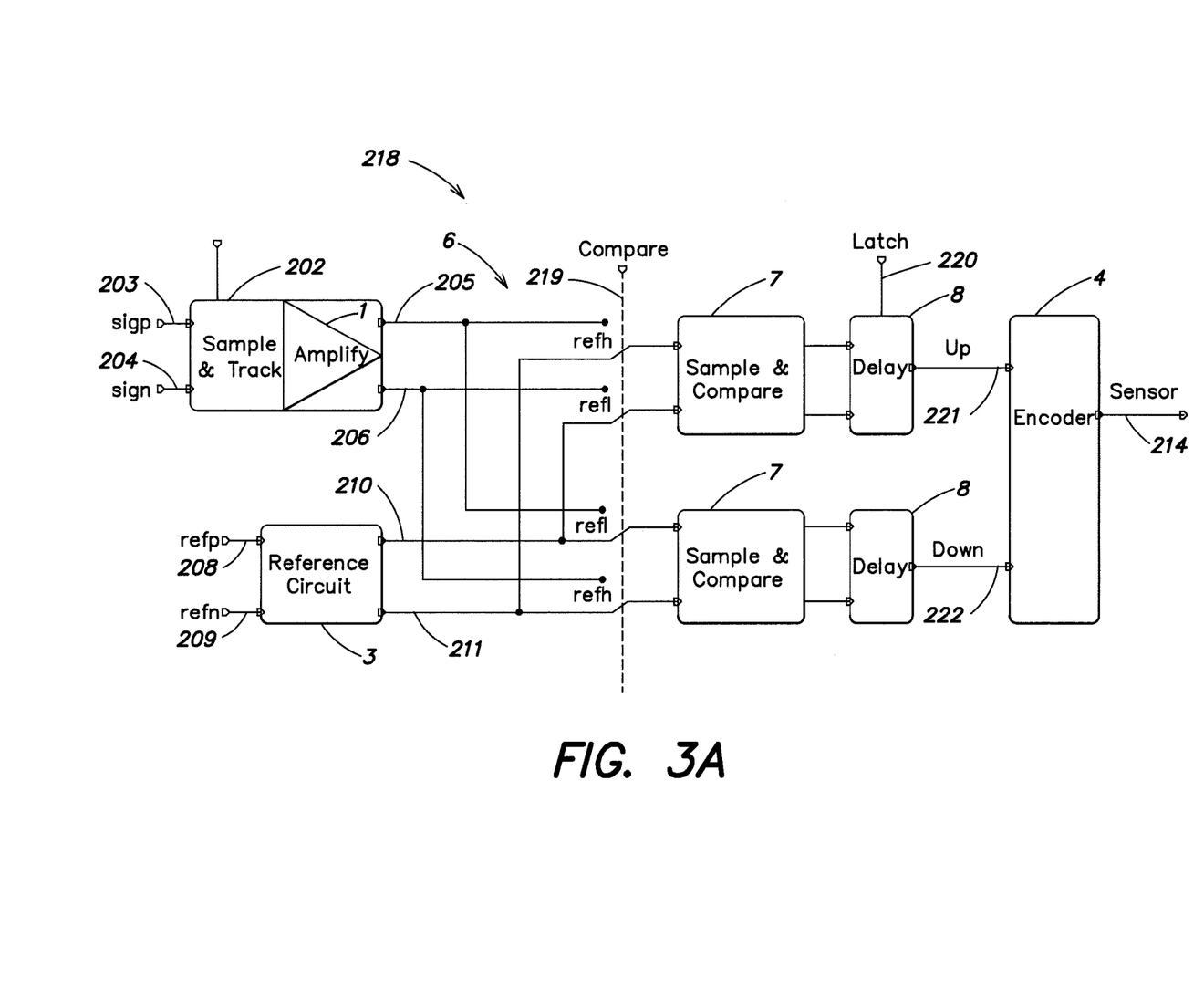
FIGS. 3a and 3b, illustrates a circuit for 1.5 bits of the sample & track topology given differential measurement (FIG. 3a) and the typical corresponding signals (FIG. 3b)
Figure 3B:
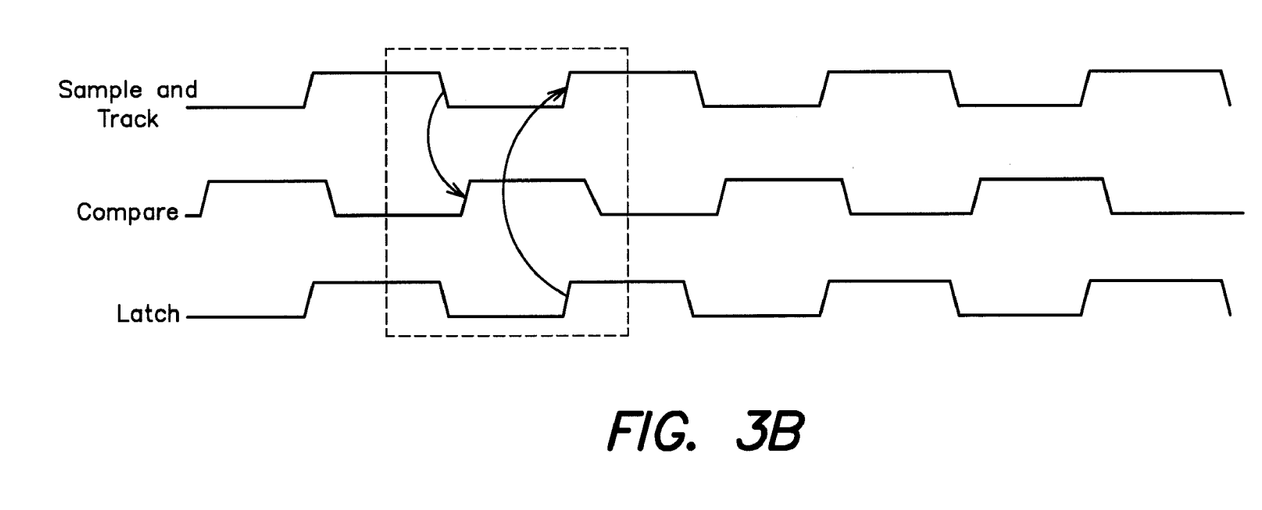

FIG. 3 illustrates a circuit 218 for 1.5 bits of the sample & track topology given a differential measurement and the typical corresponding signals are illustrated in FIG. 3b for this circuit 218.

The circuit 200 of FIG. 2a, and analogously the circuit 218 of FIG. 3a as well in the 1.5-bit implementation, detects in the sample phase the differential signal to be measured and then switches to track mode. In track mode, the initial value of the differential signal remains stored, and the change in the signal relative to the stored initial level is tracked further and amplified for a certain, preferably adjustable, time. This amplified difference between the sampled and the tracked signal value is in turn again detected at a sampling instant and compared with an appropriate number of reference values, refh, refl, as a function of the desired resolution of the gradient. The result of this comparison is recorded and encoded in the encoder 4 as required by the application.

Examples of typical control signals for this method are illustrated in FIG. 3b. As is the case in the remaining figures, identical reference notations or reference notations identified with a * are used for components and functions in the circuits that are identical or of identical effect, where in regard to the description reference is made as required to other embodiments from the other figures.

In terms of the fundamental concept, the circuit 218 of FIG. 3a corresponds to the circuit 200 of FIG. 2a for purposes of implementation. However, in contrast to the circuit 200 of FIG. 2a, a more complex circuit 218 is illustrated in FIG. 3a which replaces a standardized ADC 2. The output signals on the lines 205, 206 from the amplifier 1 are fed to a circuit 6. In addition, the reference signals, refh, refl, on the lines 210, 211 output by the reference circuit 3, are also fed to the circuit 6. To implement a comparison by the circuit 6 as a function of a comparison switching signal, compare, (FIG. 3b) on line 219, two inputs each of two sample & compare stages 7 can be selectively switched to the two outputs of the amplifier 1 on the lines 205, 206 or to the two outputs of the reference circuit 3 on the lines 210, 211. Two outputs each from the sample & compare stages 7 are applied to the associated one of a pair of delay modules 8, where a delay signal, latch, on line 220 can be applied to the delay modules 8. From the two delay modules 8, one signal each, up, down, on lines 221, 222 is applied to two inputs of the encoder 4. FIG. 3b illustrates signal states for the sampling signal, sample, or the inverted tracking signal, track, for the comparison switching signal, compare, and for the delay signal, latch. The delay signal, latch, acts slightly before the sampling signal. The sampling signal, in turn, acts slightly before the comparison switching signal.

The coding used below is simply an exemplary statement regarding a 1.5-bit resolution of the gradient. If the amplified difference is positive and exceeds a positive reference value, then the circuit 218 decides in favor of a positive gradient and sets the value of the output signal ("sensor") on the line 214 from the encoder 4 equal to a binary value of 01. Conversely, if the amplified difference falls below a negative reference value, then the circuit 218 decides in favor of a negative gradient and the signal, sensor, is set equal to 10. If the amplified difference remains within the two reference values, then the system decides in favor of negligible gradients or steady-state phase, and the signal, sensor, is set equal to 00. The reference-dependent threshold values are selected such that interfering effects such as amplifier offset and incomplete settling do not have any effect on the control.

Figure 4A:
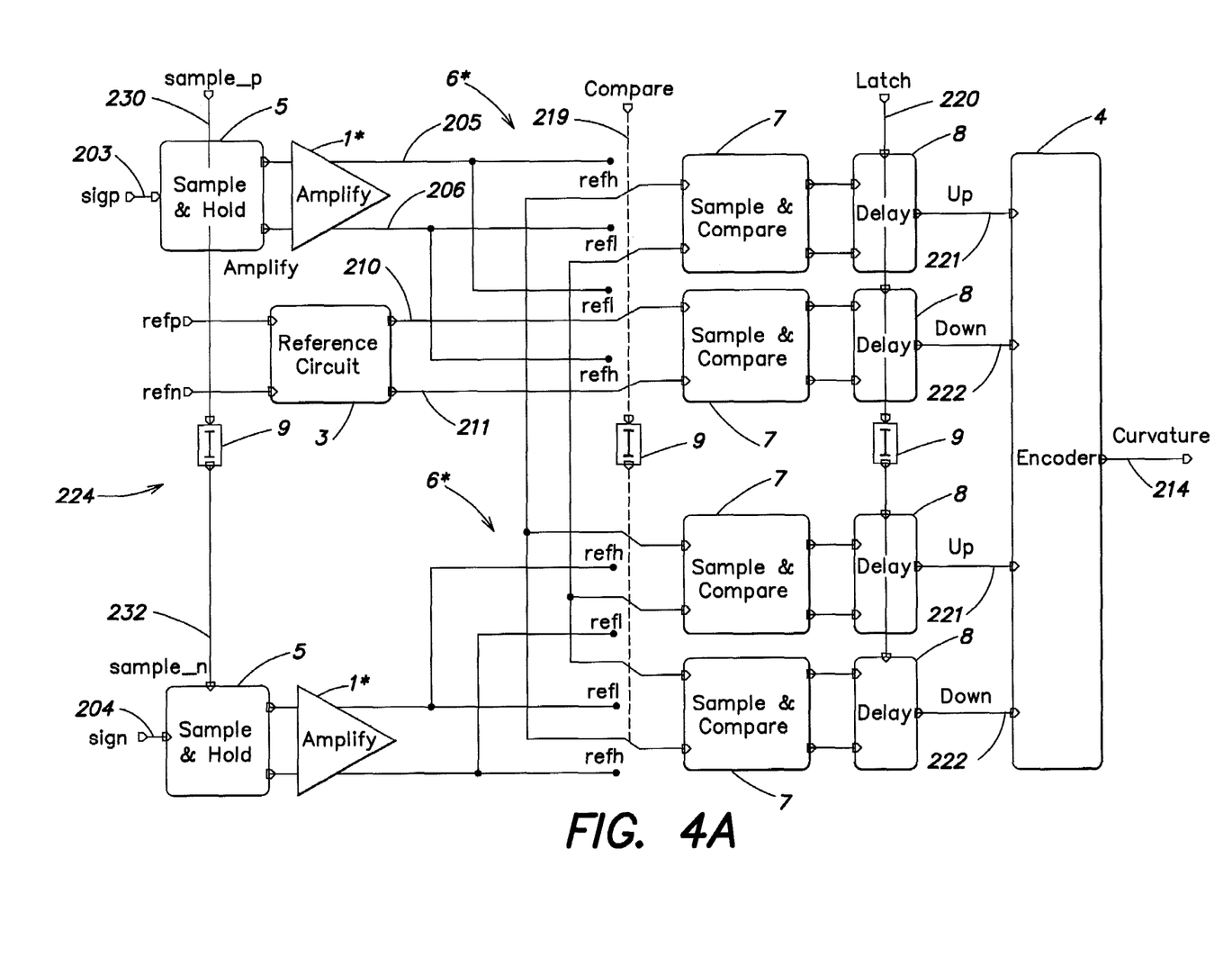
FIGS. 4a and 4b, illustrates a circuit for 1.5 bits of the sample & hold topology given two single-ended measurements (FIG. 4a) and the typical corresponding signals (FIG. 4b)
Figure 5A:
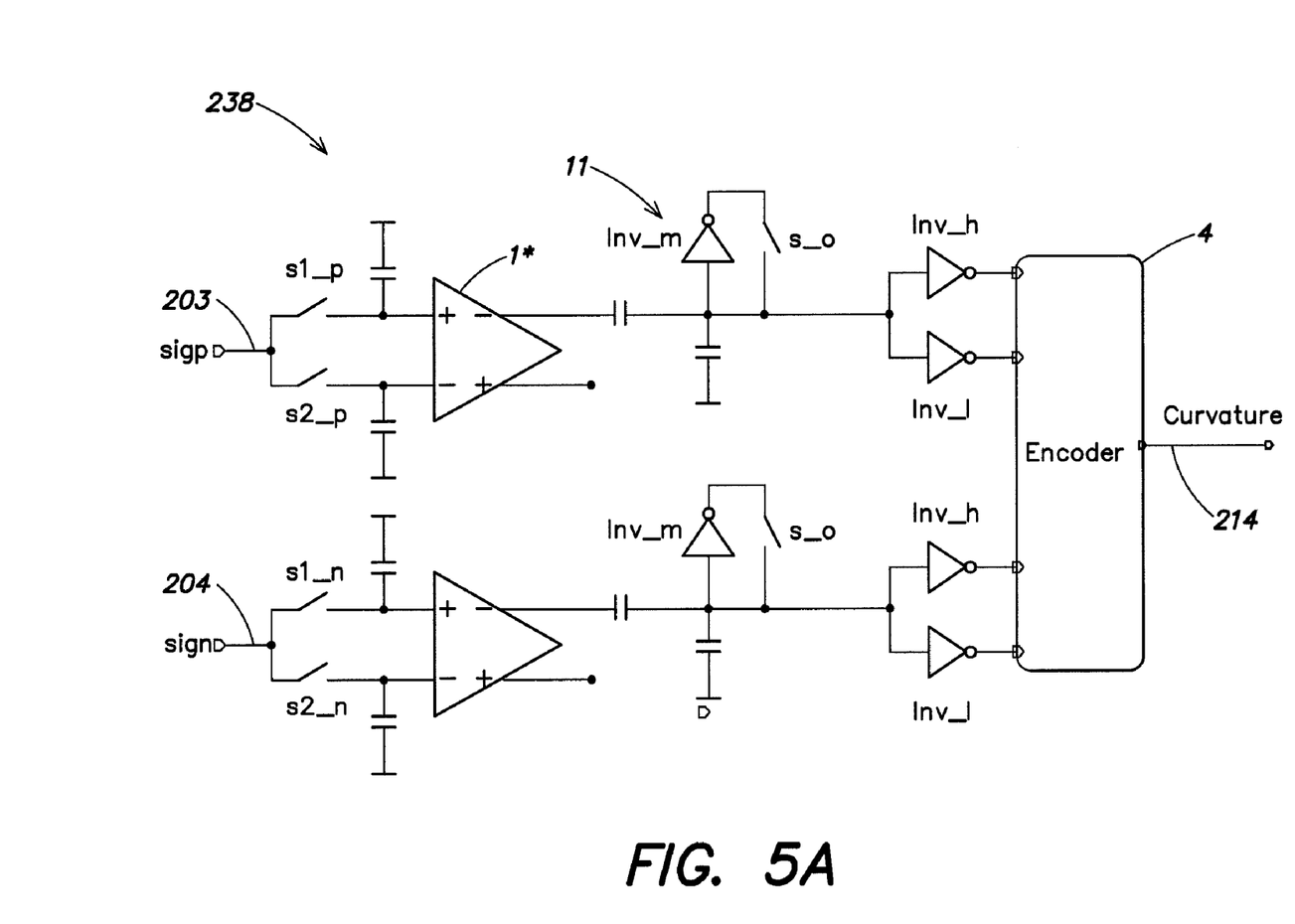
FIGS. 5a and 5b, is a schematic circuit diagram of a compact implementation of the sample & hold topology (FIG. 5a) and the typical corresponding signals (FIG. 5b)

The circuit 216 of FIG. 2b and the circuit 224 of FIG. 4a both involve a sample & hold architecture. The two measured values for determining the gradient are each detected in single-ended mode at two different times and held. A time interval, dt_grad, (FIG. 7a) between the two measured values is preferably adjustable. During the sample & hold phase, the difference between the two measured values, dV_grad, is amplified (amp-factor), compared with the reference values, refp, refh, and then encoded as required by the application.

The circuit 224 of FIG. 4a measures two successive gradients and is constructed based on the circuit 216 of FIG. 2b analogously to the way the circuit 218 of FIG. 3a is constructed based on the circuit 200 of FIG. 2a. In FIG. 4a, a circuit 6* that is switchable with the comparison switching signal, compare, on the line 219, two sample & compare stages 7, and two delay modules 8 are all connected through the circuit 6*, analogously to the circuit 218 of FIG. 3a, between the amplifier 1* and the reference circuit 3, on the one hand, and the encoder 4, on the other hand. The delay modules 8 are switched by the preferably common hold signal or delay signal, latch, on the line 220. A first input signal, sigp, on the line 203 is applied as the input signal to the sample & hold stage 5. This portion of the circuit 224 of FIG. 4a is illustrated in the upper half of FIG. 4a.

A lower portion of the circuit 224 of FIG. 4a includes analogous components and is connected in parallel to the upper portion of the circuit 224. The lower portion of the circuit 224 comprises a sample & hold stage 5, another amplifier 1*, another circuit 6*, or an appropriately extended circuit 6*, two sample & compare stages 7, and two delay modules 8, the output signals of which, up, down, on the lines 221, 222 in the encoder 4, are applied to two further inputs of the encoder 4. When this circuit is used, the encoder 4 outputs values of a signal, curvature, on the line 214 at its digital output.

One difference in the circuit 224 of FIG. 4a is that the lower portion of the circuit 224 does not need a reference circuit 3. As the reference signals, refh, refl, the output values of the reference circuit 3 from the top portion of the circuit 224 are applied to the lower portion of the circuit 6* in common to both portions of the circuit 224 or to a separate lower circuit 6*.

Figure 4B:
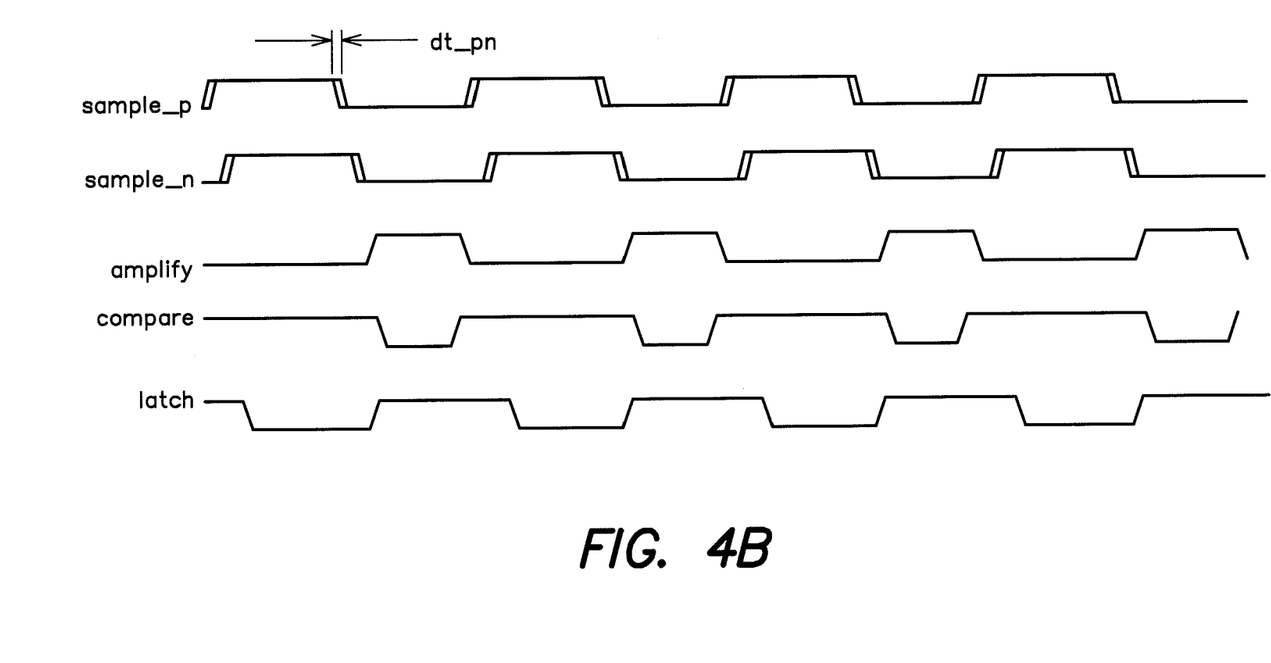

The purpose of the delay modules 8 is to indicate the time offset, dt_pn, (FIG. 7) between the two gradient measurements. Examples of relevant control signals for the circuit 224 of FIG. 4a are illustrated in FIG. 4b. There illustrated is a sampling signal, samples, as the switching signal on line 230 for the first sample & hold stage 5 to which the first input signal, sigp, on the line 203 is applied. Also illustrated is a second sampling signal, sample_n, as the switching signal on line 232 to the second sample & hold stage 5, where a second input signal, sign, is applied on the line 204 to the second sample & hold stage 5 as the input signal. The two sampling signals, sample_p and sample_n, and also analogously the comparison signal, compare, on the line 219 and the delay or hold signal, latch, on the line 220 can be coupled in a time-offset manner through appropriate coupling elements 9 from the top portion of the circuit 224 of FIG. 4a to the lower portion of the circuit 224 of FIG. 4a. The two sampling signals, sample_p, sample_n, are offset in time relative to each other by the time offset, dt_pn. Extending the edges results in an edge of the amplification signal, amplify, as can be seen as the middle signal curve in FIG. 4b. Illustrated below this signal in FIG. 4b is the comparison switching signal, compare, which is controlled as a function of the time offset, dt_pn, in connection with the rising edge of the amplification signal, amplify.

The delay modules 8 are preferably adjustable, for example, with 3 bits. In many applications, a typical adjustment range for the time offset, dt_pn, varies between 5-40% of the sampling period. A space-saving implementation thereof is as follows: the delay circuits 8 are preferably composed of an input driver, for example, an inverter, a variable RC element, a Schmitt trigger, and possibly an output driver. Adjustment of the delay occurs through multiple series-connected, for example, binary stepped resistances, which are each individually turned on or turned off through parallel-connected npmos transistor gates, in particular, with a symmetrical npmos admittance characteristic through the channel voltage. The capacitance of the RC element can be implemented by two gate oxide capacitances which are preferably connected to a base voltage or a supply voltage.

In the compact implementation of sample & hold technology of the circuit 238 of FIG. 5a, comparison with the reference occurs through asymmetrically dimensioned inverters. The first and second signal input for the input signals, sigp, sign, on the lines 203, 204 are illustrated which are switchable to the respective two amplifier inputs of two amplifiers 1° by switching devices, s1_p, s2_p, s1_n, s2_n. The given negative output of the two amplifiers 1° is fed to a pair of inverter circuits 11 through interconnected capacitors. The inverter circuits 11 are each composed of one first inverter, Inv_m, which is returned through another switch, s_o, to the input point of the first inverter, Inv_m. This input point is also connected to inputs of a second and third inverter Inv_h, Inv_1, the outputs of which are applied to the four inputs of the encoder 4.

Figure 5B:
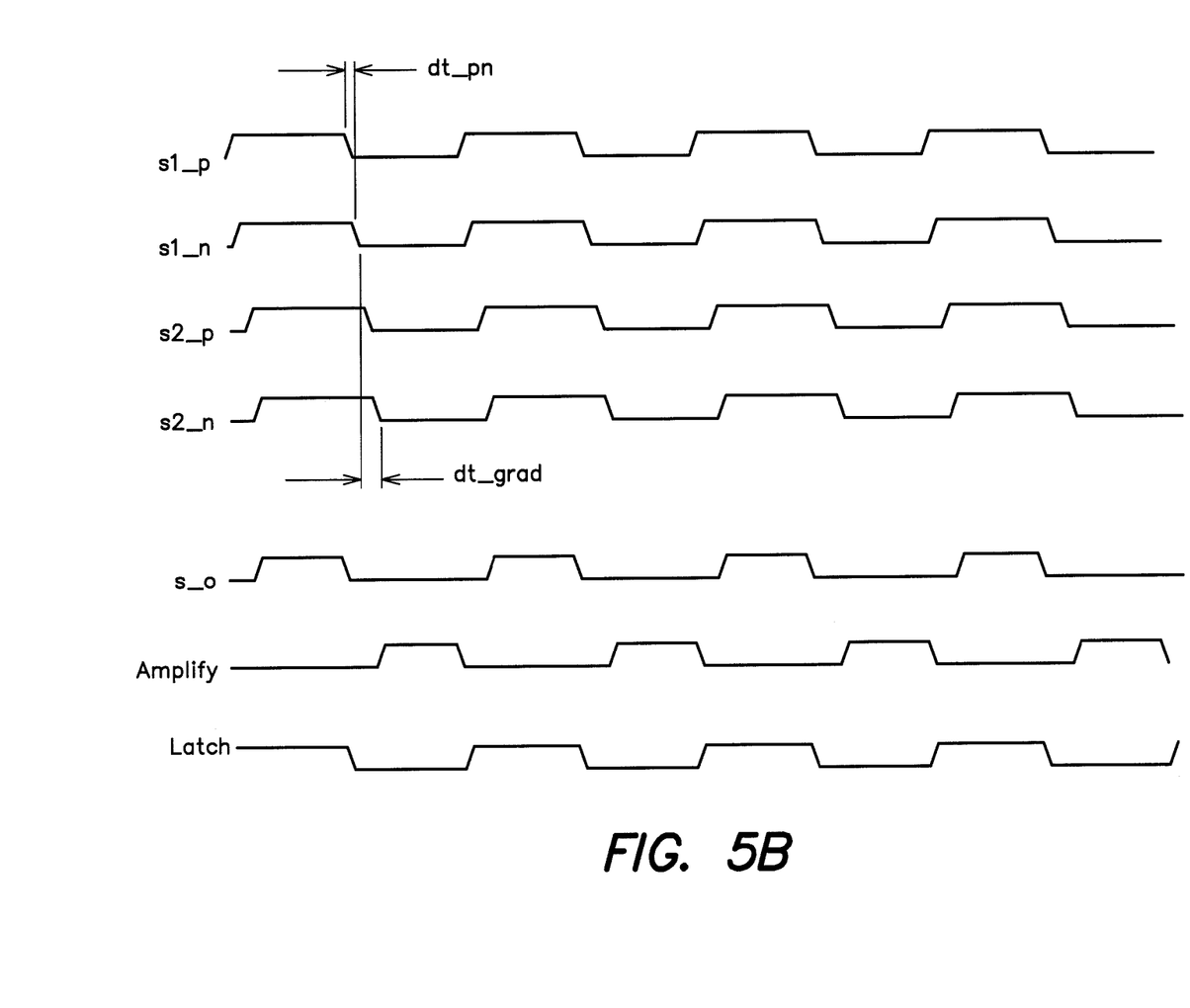

The signal, curvature, on the line 214 is determined by this circuit 238 or switching matrix as the output signal of the encoder 4, where the signal curves of FIG. 5b correspond to the signals at the appropriately identified switches as well as the amplification signal, amplify, of the amplifier 1° and the delay signal, latch. Also illustrated is the time offset, dt_pn, between signal states for the two switching signals from the top half of the circuit 238 as the time offset, dt_pn, and also the additional time offset, dt_grad, between the corresponding switching signals from the top half of the circuit 238 and the lower half of the circuit 238.

During an offset phase, the difference between the operating point of the output of the amplifier 1° and a switching point, Vs_im_m, of a symmetrically designed first inverter, Inv_m, is stored in the capacitance Coffset. The second and third inverters, Inv_h and Inv_1, dimensioned asymmetrically relative to the first inverter, Inv_m, possess second and third inverter switching points, Vs_inv_h and Vs_inv_l, which lie respectively above and below the switching threshold of the first inverter, Inv_m. The switching thresholds of these two second and third inverters, Inv_h and Inv_l, are preferably adjustable, for example by deactivating/activating parallel-connected transistors. During the amplification stage (amplify=1), the switch, s_o, is opened, and depending on the correction of the amplifier stages with the amplifiers 1°, the following switching matrix is produced by the inverters which function as comparators:

$$dV\_grad*amp > 2*(Vs\_inv\_h - Vs\_inv\_m) \rightarrow (Inv\_h\_o, Inv\_1o) = 11$$

$$2*(Vs\_inv\_h - Vs\_inv\_m) >= dV\_grad*amp >= 2*(Vs\_inv\_l - Vs\_inv\_m) \rightarrow (Inv\_h\_o, Inv\_l\_o) = 01$$

$$2*(Vs\_invl - Vs\_inv\_m) > dV\_grad*amp \rightarrow (Inv\_h\_o, Inv\_l\_o) = 00$$

A corresponding switching matrix is produced for the second gradient. The two 2-bit results (Inv_h1_o, Inv_l1_o) and (Inv_h2_o, Inv_l2_o) can be encoded, for example, in such a way as to produce a measure for the signal steepness and the change therein specifically as the signal, curvature, on the line 214:

grad1 <= Inv_h1_o XNOR Inv_l1_o;

grad2 <= Inv_h2_o XNOR Inv_l2_o;

curvature <= [grad1, grad2];

In the example, the information about the sign of the gradients is not utilized further; only the absolute values of the gradients have any effect. Thus the result for the signal, curvature, on the line 214 during sampling of a transition phase between two levels for a rising edge is as follows, illustrated in FIG. 7:

steady state 00, concave rising 01, linear rising 11, convex flattening 10, steady state 00 and for a falling edge steady state 00, convex falling 01, linear falling 11, concave flattening 10, steady state 00.

Figure 7A:
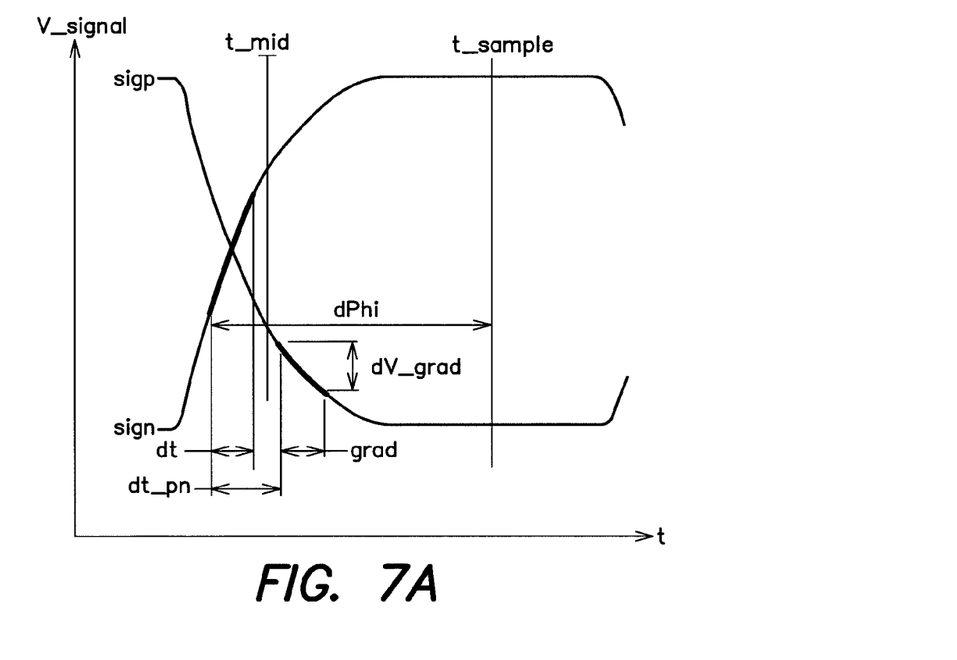
FIGS. 7a and 7b, illustrate graphs of a gradient measurement and sensor values as a function of the phase.
Figure 7B:
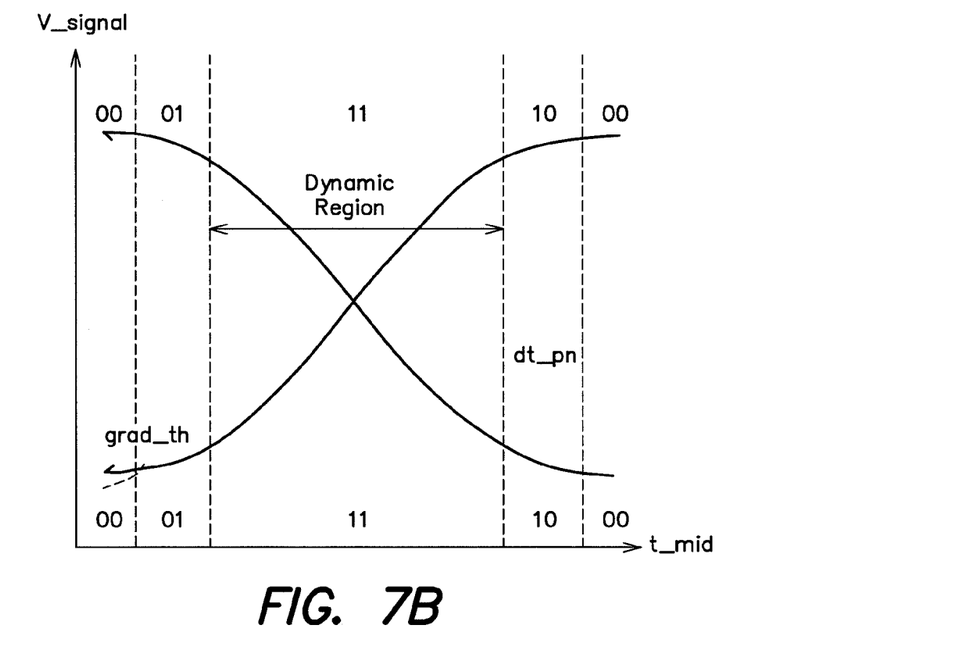

FIG. 7 illustrates a signal voltage, V_signal, over time, t, for the input signals, sigp, sign, on the lines 203, 204 in the region of the transition edges. Illustrated are the different variables that are important to the method and device of the invention. In addition to the sampling clock, t_sample, a time mean value, t_mid, between the individual differential variables is illustrated. The two time offsets, dt_grad, dt_pn, and the difference, dv_grad, of the voltage of the gradient are outlined as a differential variable. FIG. 7b illustrates the signal voltage, V_signal, as a function of the time mean value, t_mid, where again the two corresponding input signal curves are outlined. Located centrally is a dynamic region which is assigned the curvature values 11, as is also evident in the above listing analogous to a table.

The reason for this coding will become evident in the description of the control method.

The gradient measurement is effected in particular for short delay times or very high pixel frequencies, preferably using the hold & amplify method, since here the delay of the amplifier stage does not have a negative effect on determination of the gradient. In addition, for a differential signal path the two measurement processes for two successive gradients interfere with each other less if they are implemented in single-ended mode instead of differentially.

The subsequent discussion describes an example of a control method which operates using the above coding. Typically, the edges of the following clocks are significant, as is evident in FIG. 1.

The signal or pixel frequency is a frequency at which the signal level may change; the measuring clock is a frequency at which the gradient measurement is repeated; the sampling clock is a clock for signal processing having a constant offset relative to the measurement clock and a prior unknown offset to the pixel clock; and the PLL clock specifies the step size of the, in particular, digital phase control.

The control method according to the invention entails the following procedural steps. Initially, the control is in the search mode. The measurement clock is shifted, for example, in time intervals of half the PLL period, in control-specific intervals in a certain direction until a gradient is detected, for example, by the sensors according to the invention. Subsequently, the measurement clock is controlled relative to the sensor values into the region of maximum signal dynamics, corresponding to a value of the curvature signal equal to 11, that is, the average value of the signal curvature is maximized. If the measurement instant is located at the center of the transition region with a curvature equal to 11, then there is no further need for a change with respect to the phase.

If the pixel frequency now drifts relative to the measurement clock, then over time the curvature will change from 11 to 10 or 01. For the phase readjustment, the following procedure is effected, for example, for a digital clock control:

If the sum of the (10) events within a certain, preferably, adjustable number of measurement clocks exceeds a predetermined, preferably, adjustable threshold value, then the measurement clock is shortened on a one-time basis and thus shifted to the left relative to the signal curve. The sampling clock preferably has a constant phase offset to the measurement clock, which offset is adjustable depending on the application, and thus follows this shift. Analogously to the above, if the sum of the (01) events within a certain time exceeds a predetermined threshold value, the measurement clock is extended on a one-time basis and is thus shifted to the right relative to the signal curve. If both the (01) events as well as the (10) events exceed their threshold values, the phase is shifted in accordance with the more frequently occurring event. The absolute value of the phase shift can be variable and depend, for example, on the ratio of (11) to (01/10) events, and may possibly be set by the PLL frequency.

In the event a constant control is required in one given direction, the frequency of the measurement clock and sampling clock can be set permanently in response to a condition in which a preferably adjustable threshold value is exceeded. If, conversely, short-term frequency fluctuations must be readjusted, this can typically be implemented by one-time phase shifts.

If the result is a curvature equal to 00, the signal has either not completed a sufficient large level change, or the measurements were implemented within the steady-state region. In both cases, no assertion can be made about the optimal phase position and no phase change is effected. If over a certain, preferably, adjustable, time period, no gradient has been detected, the control circuit can be reset to the search mode.

The sampling clock preferably has a constant phase offset, dPhi, relative to the measurement clock, which offset is adjustable depending on the application and is thus shifted together with the measurement clock relative to the pixel clock. The phase offset is typically 40-90% of the clock period, so as to ensure that sampling occurs in the steady-state phase and is not disturbed by the measurement process. With an adjustable phase shift, it is also possible to take into account the phase shift of the measurement path.

Other approaches to implementing the concept according to the invention are also possible.

Figure 6:
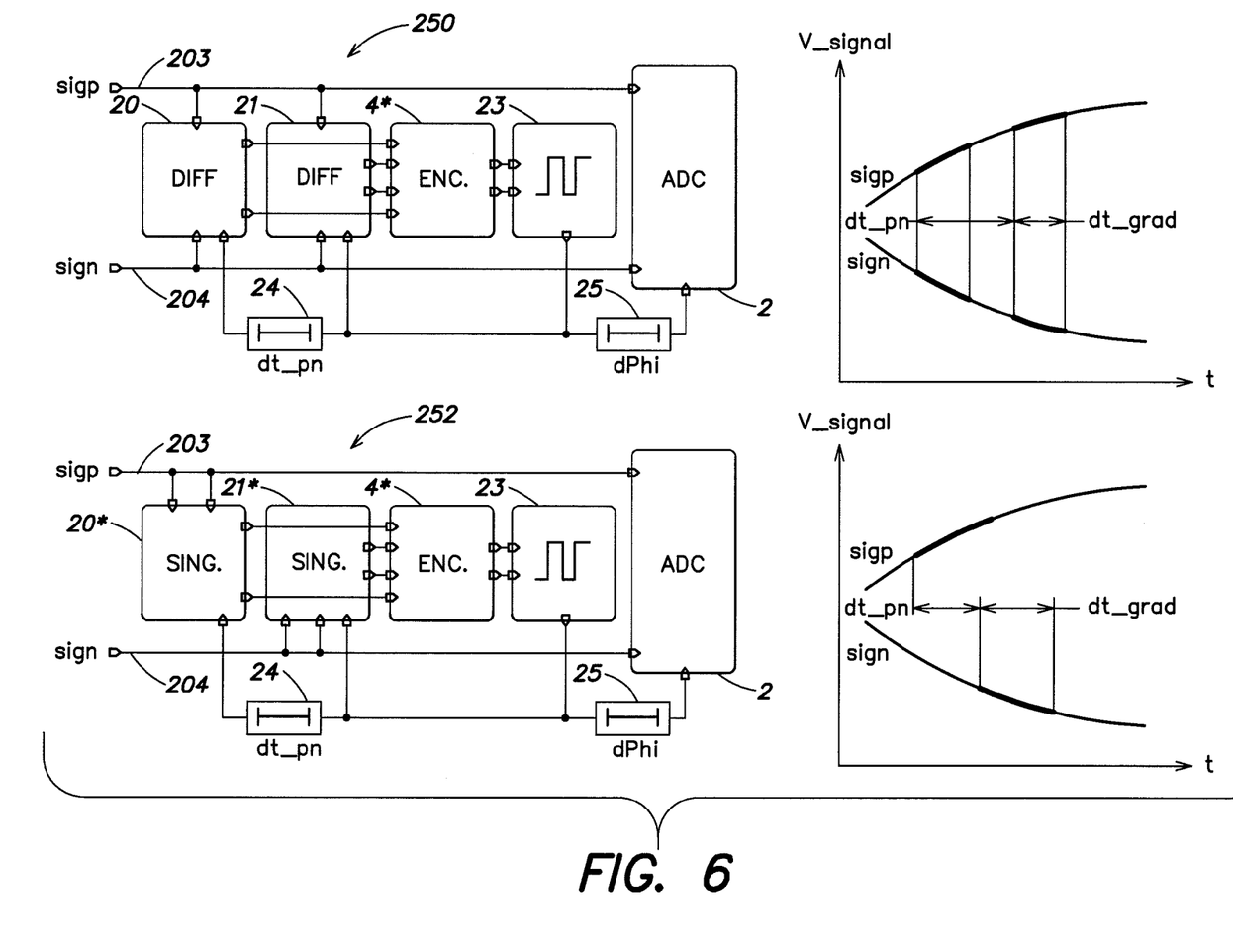
FIG. 6 is a block diagram illustrations of various sensor arrangements and associated plots.

In the previous section, two sensor implementations were described for differential and single-ended gradient measurement. In FIG. 6, examples of two systems 250, 252 for detecting and processing multiple gradient measurements are outlined. The first system 250 includes differentially-fed sensors and the second system 252 includes single-ended-fed sensors. In general, appropriate combinations of these systems are also possible. In the top circuit 250, two differential elements 20, 21 are connected between the two signal inputs to apply the input signals, sigp, sign, on the lines 203, 204, which are controlled by a clock generator 23 with a clock signal. The clock signal is delayed between the clock inputs of the two differential elements 20, 21 by the time offset, dt_pn, by an appropriate delay element 24. Two outputs each of the differentiating elements 20, 21 are applied to an encoder 4*, the outputs of which are applied at the clock generator 23. The clock signal of the clock generator 23 is also delayed by a constant phase offset dPhi by another delay element 25 and applied to the ADC 2. The two input signals, sigp, sign, are applied to this converter at appropriate inputs. The curve for the two input signals, sigp, sign, on the lines 203, 204 is illustrated in the curve for the signal voltage, V_signal, as a function of time, t. The two time offsets, dt_pn, dt_grad, are also illustrated.

In the second circuit 252, elements 20*, 21* for single-ended gradient measurement are illustrated, replacing the differential elements 20, 21. Again illustrated to the right of the circuit 252 is the curve for the signal voltage, V_Signal, as a function of time for the two input signals which are active alternately over time.

The sample & track principle can also be employed for single-ended signals.

Another control method comprises the fact that the measurement clock is controlled out of the dynamic region and into a steady-state region. This would have the disadvantage, however, that the control with respect to the phase drift has a "blind corner" and correction could be effected too late.

The control method according to the invention also functions with an analog clock control loop. Here no one-time variations of the clock period are effected for the phase shift; instead, a continuous clock adjustment is implemented. This continuous fine adjustment has the advantage over the digital clock reconstruction that no abrupt change in the sampling edges occurs. This latter occurrence results in a distortion of the sampling values analogously to a strong clock jitter.

Possible applications may be found in various circuits, for example, as a sensor for gradient measurement in analog signal curves. These sensors are required, for example, for phase adjustment to effect optimal processing of a time-discrete signal sequence (for example, to sample this sequence during steady-state phases). The sensor results can also function for the purpose of reconstructing sampled signal sequences. The circuits according to the invention can also be used to detect and correct frequency fluctuations or phase drift, possibly in connection with the control algorithm indicated. Fast adjustment control is very advantageous in particular in the case of high-speed interfaces since the ratio of phase changes to signal period becomes critical here.

No disturbance of the signal path occurs as long as the measurement takes place within a sufficient time interval relative to the sampling. If the gradient measurement is adjusted to the transition phase, the sampling in the signal path can be effected with appropriate phase offset. This offset is preferably adjustable on an applications_specific basis.

FIG. 7 illustrates signal voltages, V_signal, for the two input signals, sigp, sign, on the lines 203, 204 (FIG. 7a) and the determined curvature values (FIG. 7b). The corresponding curves for a gradient measurement and sensor values as a function of the phase are illustrated in addition to the individual described offset values and other variables, including switching variables.

To sum up, the invention relates to a device to effect a gradient determination which is designed to compare the change in a signal level between two instants with reference values, and as a function of the comparison to determine a measure for the signal gradient. This device functions to effect signal reconstruction, where, for example, the phase of the signal processing clock relative to the gradient measurement clock can be adjusted, or a measure for the signal values between multiple sampling points can be determined.

The invention also relates to a method for controlling signal curves based on gradient values, where a measure for the gradient curve or the curvature of the signal is determined from the immediate time sequence of multiple gradients. Based on a sequential evaluation of these measures, it is possible to determine the direction of the phase drift of the signal and, for example, to utilize this for synchronization or phase control.

Although the present invention has been illustrated and described with respect to several preferred embodiments thereof, various changes, omissions and additions to the form and detail thereof, may be made therein, without departing from the spirit and scope of the invention.

What is claimed is:

1. A method for determining a gradient of an input signal, comprising the steps of:
   determining a change in a level of the input signal between two instants;
   comparing the input signal level change with reference values;
   determining a measure for the gradient of the input signal as a function of the result of the step of comparing; and
   adjusting a phase of a clock for signal processing relative to a measurement clock.

2. A method for determining a gradient of an input signal, comprising the steps of:
- determining a change in a level of the input signal between two instants;
- comparing the input signal level change with reference values; and
- determining a measure for the gradient of the input signal as a function of the result of the step of comparing,
- where the step of determining comprises determining a measure for a gradient curve and/or a curvature of the input signal based on a time sequence of multiple determined gradients of the input signal.

3. The method of claim 2, where the time sequence comprises an immediate time sequence of multiple determined gradients.

4. The method of claim 2, further comprising the steps of:
- sequentially evaluating values for the curvature of the input signal;
- determining a direction of a phase drift of the input signal based on the sequential evaluation of the values for the curvature of the input signal; and
- controlling a phase of a clock for a signal processing based on the determined direction of the phase drift.

5. The method of claim 2, where a transfer rate fluctuates over time.

6. The method of claim 2, further comprising the step of controlling signal curves based on values for the determined gradients of the input signal.

7. The method of claim 6, where the measure for the gradient curve or curvature of the signal is determined from an immediate time sequence of multiple gradients.

8. A device that determines a gradient of an input signal, comprising:
- means for determining a change in a level of the input signal;
- means for comparing the input signal level change between two instants with reference values; and
- means for determining a measure for the signal gradient as a function of the comparison,
- where the means for determining a change comprises a sample and track stage, and where the means for comparing comprises a comparison circuit that compares the change in the input signal level with the reference values.

9. A device that determines a gradient of an input signal, comprising:
- means for determining a change in a level of the input signal;
- means for comparing the input signal level change between two instants with reference values; and
- means for determining a measure for the signal gradient as a function of the comparison,
- where the means for determining a change comprises a sample and hold stage, and where the means for comparing comprises a comparison circuit that compares the change in the input signal level with the reference values.

10. A device that determines a gradient of an input signal, comprising:
- means for determining a change in a level of the input signal;
- means for comparing the input signal level change between two instants with reference values; and
- means for determining a measure for the signal gradient as a function of the comparison,
- where the means for determining a change comprises one of a differential and single-ended gradient measurement stage.

11. A method for determining a gradient of an input signal, comprising the steps of:
- determining a change in a level of the input signal in a time interval;
- comparing the determined input signal level change with a number of reference values; and
- determining the gradient of the input signal as a function of the result of the step of comparing,
- where the step of determining a change comprises the steps of sampling the input signal and tracking the input signal.

12. A method for determining a gradient of an input signal, comprising the steps of:
- determining a change in a level of the input signal in a time interval;
- comparing the determined input signal level change with a number of reference values, and
- determining the gradient of the input signal as a function of the result of the step of comparing,
- where the step of determining a change comprises the steps of sampling the input signal and holding the input signal.

13. A method for determining a gradient of an input signal, comprising the steps of:
- determining a change in a level of the input signal in a time interval;
- comparing the determined input signal level change with a number of reference values; and
- determining the gradient of the input signal as a function of the result of the step of comparing,
- where the input signal comprises a pair of input signals.

14. A method for determining a gradient of an input signal, comprising the steps of:
- determining a change in a level of the input signal in a time interval:
- comparing the determined input signal level change with a number of reference values, and
- determining the gradient of the input signal as a function of the result of the step of comparing,
- where the pair of input signals comprise differential input signals.

15. A method for determining a gradient of an input signal, comprising the steps of:
- determining a change in a level of the input signal in a time interval;
- comparing the determined input signal level change with a number of reference values; and
- determining the gradient of the input signal as a function of the result of the step of comparing,
- where the input signal comprises a single ended input signal.

16. A method for determining a gradient of an input signal, comprising the steps of:
- determining a change in a level of the input signal in a time interval;
- comparing the determined input signal level change with a number of reference values; and
- determining the gradient of the input signal as a function of the result of the step of comparing,
- where the step of determining comprises determining a measure for one of a gradient curve and a curvature of the input signal based on a time sequence of multiple determined gradients of the input signal.

* * * * *